(12) United States Patent
Fleiner et al.

(10) Patent No.: US 7,746,233 B2
(45) Date of Patent: Jun. 29, 2010

(54) SAFETY SWITCH FOR MONITORING A CLOSED POSITION OF TWO PARTS MOVEABLE RELATIVE TO ONE ANOTHER

(75) Inventors: Jürgen Fleiner, Reutlingen (DE); Steffen Barth, Stuttgart (DE); Dietrich Blaschke, Uhingen (DE)

(73) Assignee: Pilz GmbH & Co. KG, Ostfildern (DE)

( * ) Notice: Subject to any disclaimer, the term of this patent is extended or adjusted under 35 U.S.C. 154(b) by 1027 days.

(21) Appl. No.: 11/481,991

(22) Filed: Jul. 6, 2006

(65) Prior Publication Data

US 2007/0013236 A1    Jan. 18, 2007

Related U.S. Application Data

(63) Continuation of application No. PCT/EP2004/014200, filed on Dec. 14, 2004.

(30) Foreign Application Priority Data

Jan. 9, 2004   (DE) .................. 10 2004 002 438
Aug. 12, 2004  (DE) .................. 10 2004 039 975

(51) Int. Cl.
    *G08B 13/14*   (2006.01)
(52) U.S. Cl. .................. 340/572.8; 340/545.1
(58) Field of Classification Search .......... 340/545.1, 340/825.29, 572.8; 235/449
    See application file for complete search history.

(56) References Cited

U.S. PATENT DOCUMENTS

| | | | |
|---|---|---|---|
| 4,643,508 A | 2/1987 | Schaller | |
| 4,757,213 A | 7/1988 | Tigges et al. | |
| 4,773,094 A * | 9/1988 | Dolby | .................. 381/58 |
| 6,409,083 B1 * | 6/2002 | Link | .................. 235/449 |

| | | | |
|---|---|---|---|
| 2002/0039023 A1 | 4/2002 | Jagiella et al. | |
| 2003/0062980 A1 | 4/2003 | Scheible et al. | |

FOREIGN PATENT DOCUMENTS

| | | |
|---|---|---|
| DE | 79 27 546 | 2/1980 |
| DE | 30 45 848 A1 | 7/1982 |

(Continued)

OTHER PUBLICATIONS

Michael Euchner; Operating Instructions Non-Contact Safety Switch CES-A-C5E-01/CES-A-C5H-01 / CES-A-C5H-01/ES; Apr. 2006; 13 pages.

(Continued)

*Primary Examiner*—Daniel Wu
*Assistant Examiner*—Shirley Lu
(74) *Attorney, Agent, or Firm*—Harness, Dickey & Pierce, P.L.C.

(57) ABSTRACT

A safety switch, which is particularly intended for monitoring a guard door on an automated installation, has an actuator and a sensor. The actuator comprises an actuator antenna and the sensor comprises a sensor antenna. The actuator and the sensor are coupled to one another like a transformer, in particular like a transponder, when the guard door is in the closed position. According to one aspect of the invention, the sensor antenna has a magnetic directional characteristic which allows transformer coupling with the actuator in at least two mutually perpendicular spatial directions as seen from the sensor antenna.

21 Claims, 4 Drawing Sheets

FOREIGN PATENT DOCUMENTS

| | | |
|---|---|---|
| DE | 32 03 520 A1 | 8/1983 |
| DE | 100 55 404 A1 | 9/2001 |
| DE | 102 22 186 C1 | 10/2003 |
| DE | 103 34 653 B4 | 3/2005 |
| EP | 0 968 567 B1 | 1/2000 |
| JP | 59 186422 | 7/1983 |
| WO | WO 2005/013488 | 2/2005 |

OTHER PUBLICATIONS

Series BZ16 Dual-Channel Non-Contact Safety Interlock Switch; 2 pages, prior to Jan. 9, 2004.

Series BNS16 Coded-Magnet Sensors; 2 pages, prior to Aug. 12, 2004.

EN954-1; Safety-related parts of control systems; Dec. 1996; 34 pages.

* cited by examiner

SAFETY SWITCH FOR MONITORING A CLOSED POSITION OF TWO PARTS MOVEABLE RELATIVE TO ONE ANOTHER

CROSS REFERENCE TO RELATED APPLICATIONS

This application is a continuation of international patent application PCT/EP2004/014200 filed on Dec. 14, 2004 and published as WO 2005/067145 A1 in German language, which international patent application claims priority from German patent applications DE 10 2004 002 438.3 filed on Jan. 9, 2004 and DE 10 2004 039 975.1 filed on Aug. 12, 2004.

BACKGROUND OF THE INVENTION

The present invention relates to a safety switch for monitoring an adjacent position of two parts that are moveable relative to each other, and more particularly, the invention relates to a safety switch for monitoring a closed position of a guard door in an automated installation.

Safety considerations relating to protection against accidents are playing an increasingly major role in the planning and design of automated installations. Various protective measures are used to make the installations safe, such as emergency-off switches, light barriers and what is known as guard doors, which prevent access to a dangerous part of the installation in conjunction with guard fences. The opening of the guard door has to be detected in a fail-safe manner during operation of the installation, since the open guard door represents a safety risk. The relevant European Standard EN 954-1 and related or comparable regulations (for example the new IEC EN 61508 or prEN ISO 13849-1 which is derived from the latter) stipulate the requirements for the protective measures. The present invention relates to safety switches which are intended and designed for these safety related applications, and thus the safety switches satisfy at least Category 3 of EN 954-1, or comparable safety requirements.

There are various approaches for implementing safety switches in order to monitor the closed position of a guard door, and more generally the closed position of two parts moveable relative to one another, with a sufficient degree of fail-safety. In addition to mechanical switches, which can also provide an interlocking function, there are various types of non-contact safety switches. These offer advantages in dirty environments. The actuator and sensor In one known type of non-contacting safety switches, the actuator and sensor are magnetically coupled to one another in the closed position. In order to prevent manipulation, coded magnet arrangements are used in some cases.

In another type of non-contacting safety switch, individually coded communication is used between the sensor and the actuator, with this communication being possible only when the moving parts are in the closed or adjacent position. For safety switches of this kind, so-called transponders (in some cases also referred to as "tags") are particularly used. The transponders transmit an individual coding to the sensor when they are transformer-coupled to that sensor. A safety switch of this kind is marketed by the company Eucher GmbH & Co. KG, 70771 Leinfelden-Echterdingen, Germany, under the product name CES.

Another prior art safety switch is offered by the company K. A. Schmersal GmbH, 42232 Wuppertal, Germany, under the product name BZ 16. This prior art safety switch suffers from the disadvantage that a dedicated switch variant has to be used for each direction of approach, i.e. the direction of approach from the actuator to the sensor. By way of example, if a safety switch is required for an application in which the actuator is intended to be moved toward the sensor from above rather than from the front, a different variant of the known safety switch is required. This not only makes it more difficult to install the safety switch but also leads to increased storage costs, both for the manufacturer and for the user, since it is desirable to always have a certain number of spare parts of important components available for smooth production.

In the case of the CES safety switch from Euchner, it is possible to mount the "sensor head" (i.e. that part of the sensor which contains the sensor antenna) in different orientations on the safety switch in order to avoid this problem. Different approach directions can thus be achieved by tilting the sensor head. This solution allows reduced storage, but results in a complicated installation.

SUMMARY OF THE INVENTION

Against this background, it is an object of the present invention to provide for a safety switch that is simpler to install. It is another object to provide for a safety switch that offers reduced storage efforts.

According to one aspect of the invention, there is provided a safety switch for monitoring a closed position of a guard door in an automated installation, said guard door comprising a fixed part and a moveable part, and the safety switch comprising an actuator and a sensor each adapted to be secured to one of the parts, wherein the actuator has a transponder including an actuator antenna and the sensor has a sensor antenna, wherein the antennas are configured to establish a transponder coupling, when the parts are in the closed position, and wherein the sensor antenna has a magnetic directional characteristic which allows the transponder coupling in at least two spatial directions that are mutually perpendicular seen from the sensor antenna.

According to another aspect of the invention, there is provided a safety switch for monitoring an adjacent position of two parts which are moveable relative to one another, comprising an actuator and a sensor each adapted to be secured to one of the parts, wherein the actuator has an actuator antenna and the sensor has a sensor antenna, wherein the antennas are configured to establish a defined transformer coupling, when the parts are in the adjacent position, and wherein the sensor antenna has a magnetic directional characteristic which allows the defined transformer coupling in at least two spatial directions that are mutually perpendicular seen from the sensor antenna The sensor antenna of the new safety switch has a new directional characteristic allowing different approach directions for the actuator for the first time. As will be shown further below, the directional characteristic in a specific situation also depends on the orientation of the actuator with respect to the sensor antenna. This even ore enhances the possibilities of approaching the sensor. Preferably, the directional characteristic of the sensor antenna is configured such that the mutually perpendicular approach directions each ensure a defined switching distance. In this context, the switching distance is that (maximum) distance between the sensor and actuator from which the safety switch detects the closed position of the moveable parts.

For the field of interest, the inventive solution thus for the first time makes use of a sensor antenna that has more than only one predefined preferential direction. In contrast to this, all of the known safety switches in the prior art use sensor antennas that have a directional characteristic with only one usable preferential direction. Therefore, it is necessary either to provide different switch variants or to rotate the sensor head to the desired direction in the case of the prior art safety switches. In contrast, the present solution uses a sensor antenna which in the simplest case is omnidirectional and in principle can be approached from any desired spatial directions.

The invention is based, inter alia, on the discovery that there is no need to have a directional characteristic with only one preferential direction in order to ensure the required safety. In theory, the different approach directions open up the possibility of manipulation. However, this can be reliably coped with in a different way, in particular when using individually coded transponders. There is either no need for a sensor antenna with only one preferential direction in order to ensure a defined switching distance. As practical test by the assignee have shown, defined switching distances can also be achieved from a plurality of approach directions using the solution according to the invention.

The novel safety switch allows the installation position or orientation of the sensor to be changed easily without having to reinstall or modify mechanical parts for this purpose. The novel safety switch can thus be used flexibly in different approach directions. The storage costs are reduced without any additional installation effort. The objects mentioned above are completely achieved.

Furthermore, the novel solution has the advantage that the housing design for the safety switch is simplified, in particular when housings including a protection against dirt and water spray are desired.

In a preferred refinement, the sensor antenna has an substantially omnidirectional characteristic.

In this refinement, the sensor antenna is designed not only for two approach directions but allows the actuator to be approached from numerous spatial directions. The omnidirectional characteristic may in this case be restricted to one plane, i.e. allowing it to be approached from the front, from the right, from the left and possibly from the rear. In one preferred refinement, the omnidirectional characteristic is, however, three-dimensional, i.e. the novel sensor antenna can also be approached from above or from underneath. Ideally, the novel sensor antenna thus has an isotropic directional characteristic, although the persons skilled in the art will be aware that an exact spherical shape (without any notches or "dents") is scarcely feasible in practice. An omnidirectional characteristic in terms of the present invention is thus also provided when the actuator can successfully approach the sensor from numerous different spatial directions. This refinement furthermore does not preclude individual spatial directions being precluded for other reasons, for example owing to mechanical obstructions caused by supply cables.

The preferred refinement leads to a particularly high degree of flexibility for the novel safety switch with respect to the installation position and orientation. Furthermore, this refinement has the advantage that the sensor antenna can be produced and installed in the safety switch with wider tolerances, thus reducing the production costs.

In a further refinement, the sensor antenna comprises a plurality of antenna elements with differently aligned directional characteristics.

In an exemplary embodiment, the sensor antenna comprises, for example, two antenna elements which are arranged at right angles to one another and each are "responsible" for one or two approach directions. An omnidirectional characteristic with a high degree of uniformity can be achieved by switching between the antennas or else by superimposition of the directional characteristics during simultaneous operation.

This refinement makes it easier to achieve identical switching distances in different approach directions.

In a further refinement, the sensor antenna comprises an air coil.

the use of coils as sensor antennas is not unusual for safety switches in the prior art. However, in all the situations known so far, the coils are used in a ferrite pot in order to achieve the conventional (one-sided) directional characteristic. An air coil in terms of the present invention, in contrast, is a conductor loop which operates without a ferrite pot (but possibly with a ferrite core in order to increase the inductance). The material costs and the assembly effort in production are decreased by the reduced range of components in this refinement. Furthermore, an air coil in its own offers a field distribution which allows a plurality of mutually perpendicular approach directions.

In a further refinement, the sensor antenna comprises a coil which is flatly arranged flat on a circuit board for the sensor. It is particularly preferred if the coil is in the form of a conductor track on the circuit board.

This refinement allows the novel safety switch to be physically particularly small and flat. Surprisingly, it has been found that this reduction in the physical size is possible without any significant restrictions relating to the range (switching distance) of the novel safety switch. In contrast, the novel flat shape allows the novel safety switch to be installed closer to door rails or the like, so that the effectively usable range coverage even becomes greater. Furthermore, this refinement allows for a cost reduction, since housing parts may be smaller. It is particularly cost-effective for the coil to be in the form of a conductor track on the circuit board, because this allows particularly economic production.

In a further refinement, the directional characteristic has a stronger first preferential direction and a weaker second preferential direction for the transformer coupling, wherein the sensor antenna is arranged in an antenna housing having housing walls, and wherein a distance between the sensor antenna and the housing wall in the first preferential direction is longer than in the second preferential direction.

In this refinement, the sensor antenna is arranged further away from the housing wall in the first, stronger preferential direction than in the second, weaker preferential direction. The greater distance and the field strength, which decreases with distance, make it possible to easily and elegantly compensate for different switching distances in the different approach directions. This refinement of the novel safety switch thus has a more uniform response in the different approach directions.

In a further refinement, the sensor antenna, perpendicular to the first preferential direction, is arranged at same distances from at least two housing walls.

This refinement is particularly advantageous when an air coil is used as the sensor antenna, since its field distribution is largely rotationally symmetrical at right angles to the coil longitudinal axis. The response of the novel safety switch is made even more uniform by use of the same distances from the housing walls perpendicular to the first preferential direction.

In a further refinement, the novel safety switch has a sensor housing having a mounting face, wherein a field insulation is arranged between the sensor antenna and the mounting face. An electrically and/or magnetically conductive plate may be used, in particular, as the field insulation, i.e. a copper, aluminum, iron, soft-iron and/or ferrite plate by way of example.

This refinement overcomes a possible disadvantage of the novel safety switch, specifically the possibility of the directional characteristic being influenced by materials at the installation location. Typically, a mounting face of safety switches of the prior art is screwed to one of the parts which can move relative to one another, such as to a door frame by way of example. If this door frame is composed of metal, the directional characteristic of the sensor antenna may be influenced. In consequence, the switching distances may vary. In the preferred refinement, this influence is reduced and/or is anticipated in a deterministic manner. Installation of the sensor on a metal plate thus has no influence, or at least considerably less influence, on the sensor antenna. The operating parameters of the novel safety switch can be complied with at smaller tolerances.

In a further refinement, the distance between the sensor antenna and the mounting face is approximately 5 mm or more.

This refinement also contributes to minimizing the influence of any metallic mounting surface on the safety switch. The stated distance of approximately 5 mm between the sensor antenna and the mounting face, measured as the distance between the outer face of the antenna and the outer housing face intended for installation, has been found to be sufficient for reliable operation in practical test. Greater distances further reduce the influence of the installation location. If the distances are significantly less, this results in the installation location having an excessive influence on the switching distances for the safety application.

In a further refinement, the actuator antenna has a first orientation for the transformer coupling in a first of the at least two perpendicular spatial directions, and has a second orientation for the transformer coupling in a second of the at least two perpendicular spatial directions, wherein the first and the second orientations are rotated by about 90° with respect to one another.

In other words, this means that the actuator (with its actuator antenna) is rotated as a function of the desired approach direction. In principle, as an alternative to this, it is also possible to leave the orientation of the actuator unchanged for each approach direction. The preferred refinement, in contrast, has mechanical advantages. This is because, in order to ensure a defined switching distance, it is desirable to use a relatively large coil diameter of, for example, 28 mm for the actuator antenna. On the other hand, the actuator antenna may be relatively flat on the antenna axis, so that the actuator is much shorter on the antenna axis than to the side of it. The preferred refinement has the advantage that the actuator in each case can be moved to the same distance from the sensor, irrespective of the approach direction. This simplifies installation and makes it easier to provide defined switching distances.

It is self-evident that the features mentioned above and those yet to be explained below can be used not only in the respectively stated combination but also in other combinations or on their own without departing from the scope of the present invention.

BRIEF DESCRIPTION OF THE DRAWINGS

Exemplary embodiments of the invention will be explained in more detail in the following description, and are illustrated in the drawing, in which.

DESCRIPTION OF PREFERRED EMBODIMENTS

Figure 1:
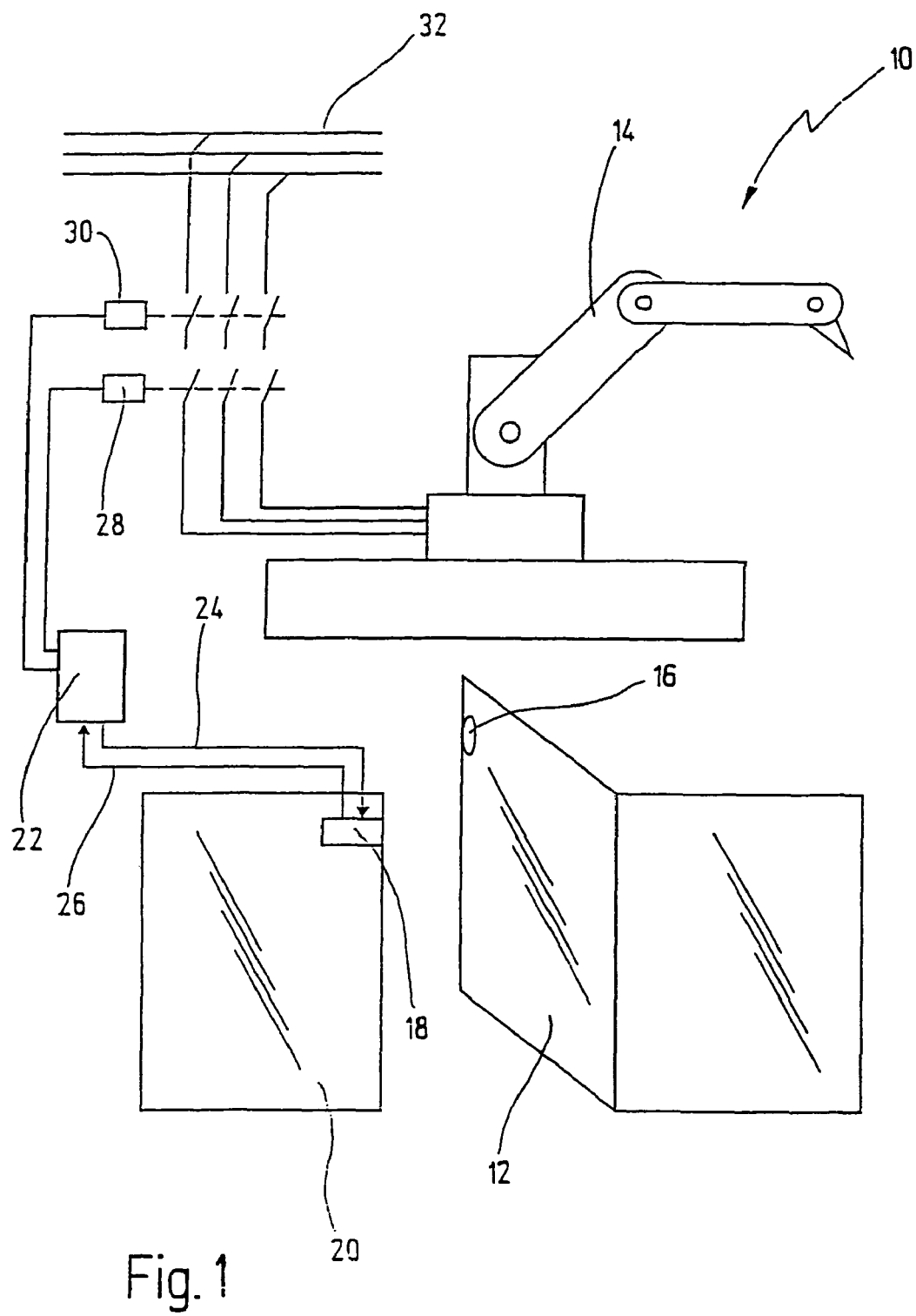
FIG. 1 shows a schematic illustration of an automated installation with the novel safety switch.

In FIG. 1, an automated installation including the novel safety switch is denoted by the reference number 10 in total. In this case, the safety switch is used to monitor the closed position of a guard door 12, which in turn is intended to make the installation safe. By way of example, the installation is illustrated here as a robot 14. However, the field of use of the novel safety switch is not restricted to this specific example. In general, the novel safety switch can be used for safe monitoring of any of its (closed) positions of two parts which can move relative to one another. This also includes, for example, the monitoring of a piston position relative to a piston cylinder or another piston, in which case the expression "closed position" means that the piston is located in the area of the other object.

The safety switch comprises an actuator 16 and a sensor 18. The actuator 16 is secured to the guard door 12. The sensor 18 is secured to a wall 20 (or to a frame, which is not illustrated here, for the guard door 12). When the guard door 12 is in the closed state (not illustrated here), the actuator 16 is in the physical vicinity of the sensor 18, which leads to transponder-like coupling between the actuator 16 and the sensor 18 in a manner which will be explained in more detail further below. When the guard door 12 is opened, the actuator 16 is moved away from the sensor 18, which results in the transponder-like coupling being "torn apart". The sensor 18 then produces a switching signal which causes the robot 14 to be switched off.

In this case, the sensor 18 is connected to a safety switching device 22 via two lines. A first line 24 leads from the safety switching device 22 to the sensor 18. Test signals can be transmitted to the sensor 18 via this line by the safety switching device 22, in order to check its operation. Via the second line 26 the safety switching device 22 receives a switching signal which is produced by the sensor 18 and signals that the guard door 12 is in the closed state. One preferred type of monitoring of the sensor by the safety switching device 22 is described in the German patent application having the file reference 103 34 653.8, the entire contents of which are incorporated by reference here. As an alternative to this, however, the sensor 18 may also be designed in a different fail-safe manner, within the sense of the relevant regulations (at least Category 3 in EN 954-1; or comparable safety requirements). By way of example EP 0 968 567 B1, which was cited initially, describes an implementation with a two-channel evaluation structure.

On the output side, the safety switching device 22 here controls two contactors 28, 30 whose make contacts are arranged in an electrical power supply 32 to the robot 14 in a manner known per se. Via the contactors 28, 30, the safety switching device 22 interrupts the electrical power supply to the robot 14 when the actuator-sensor combination 16, 18 finds that the guard door 12 is open, or when an undefined and thus safety-critical state is identified in the course of the fault monitoring mentioned before.

The safety switching device 22 is preferably a device which complies with Category 4 of European Standard EN 954-1 or with a comparable safety standard. By way of example, the safety switching device is of the PNOZ®elog type from the applicant of the present invention. As an alternative to this, however, the sensor 18 could also be connected to a programmable safety controller, as it is marketed by the present applicant under the brand name PSS®.

Figure 2:
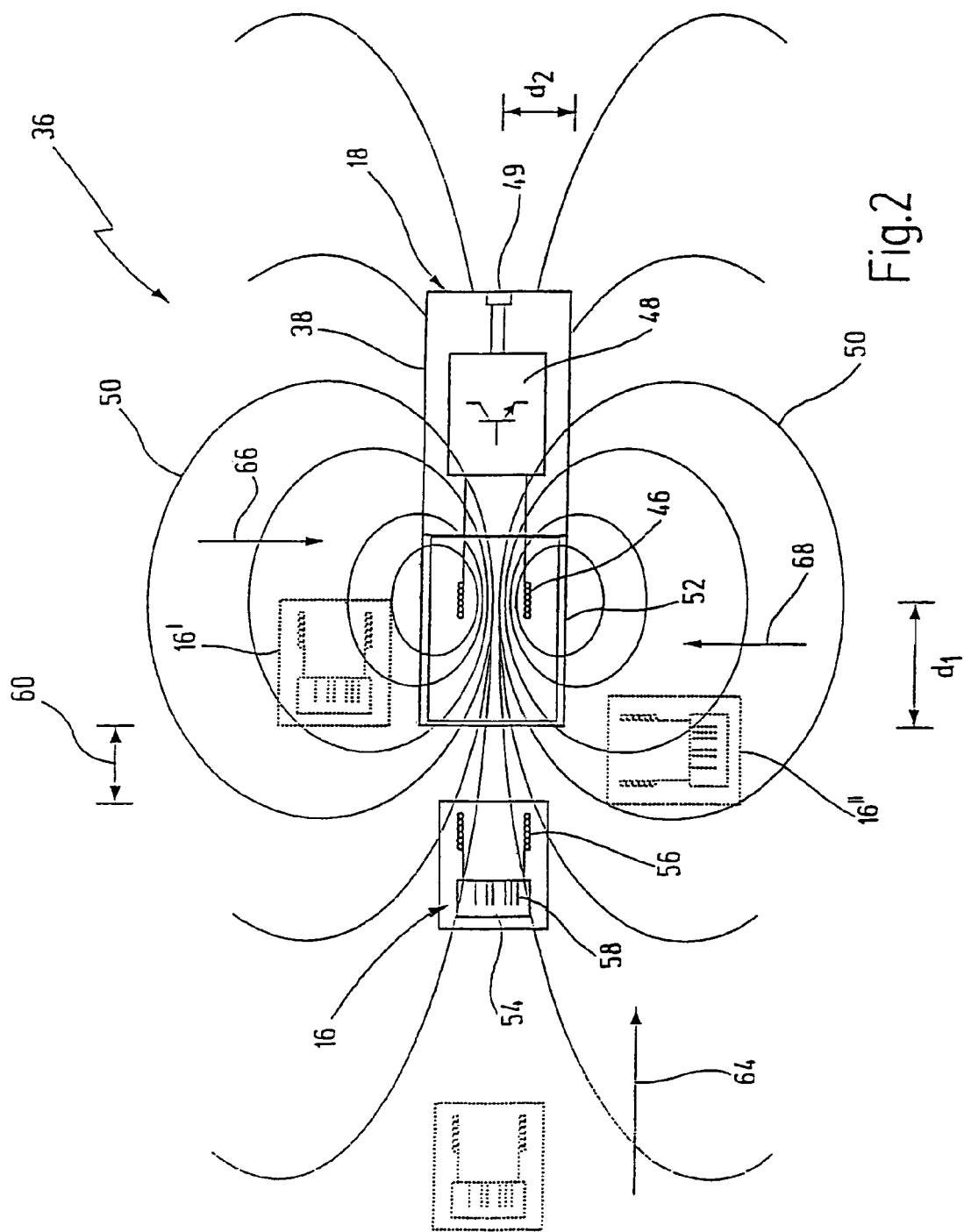
FIG. 2 shows a simplified illustration of one exemplary embodiment of the novel safety switch.

In FIG. 2, an exemplary embodiment of the novel safety switch is denoted by the reference number 36 in total. Apart from this, same reference symbols denote the same elements as before.

Figure 3:
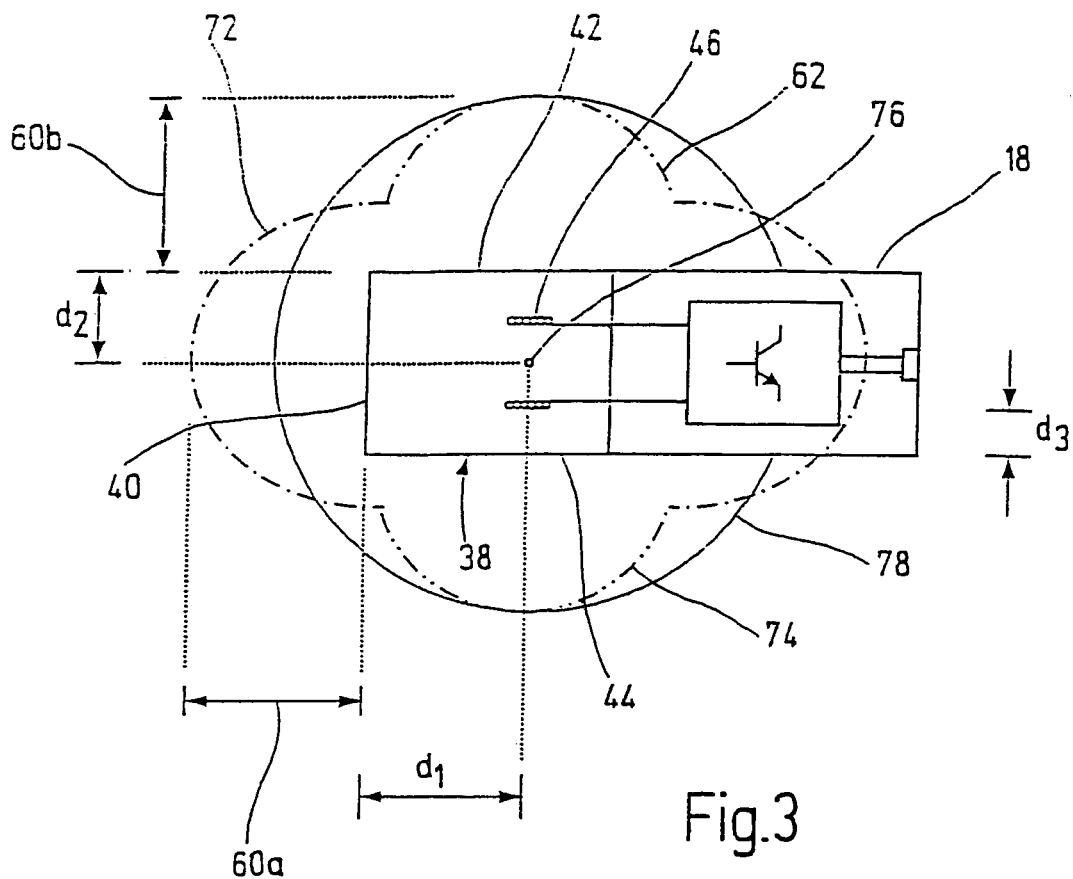
FIG. 3 shows a simplified illustration of the safety switch from FIG. 2, with its magnetic directional characteristic.

The sensor 18 for the safety switch 36 has a sensor housing 38 with housing walls 40, 42, 44 (see FIG. 3). The sensor housing is split in two in this case. The sensor antenna 46 is arranged in a first part and in the form of an air coil here. The air coil 46 is illustrated schematically here, in a section parallel to the coil longitudinal axis.

An electronic circuit 48, to which the sensor antenna 46 is connected, is arranged in the second part of the sensor housing 38. In particular, the circuit 48 contains what is called a tag reader, i.e. a circuit which decodes transponder signals from the actuator 16 and produces the individual tag or identification as a data value. It also comprises a fail-safe evaluation unit, which produces a switching signal for the safety switching device 22 as a function of the signals from the actuator 16. For this purpose, the circuit 48 can be connected to the safety switching device 22 via a connection 49.

The two-part configuration of the sensor housing 38 is not essential for practical implementation of the present invention but has advantages since it allows a more uniform field distribution for the sensor antenna 46 and better decoupling for the circuit 48.

The reference number 50 denotes the magnetic lines of force which characterize the magnetic field around the air coil 46. The lines 50 are formed largely rotationally symmetrically with respect to the longitudinal axis of the air coil 46. For the sake of clarity, the illustration does not show any disturbances in the ideally typical profile illustrated here, caused, for example by the circuit 48 or metal parts in the vicinity of the sensor.

One embodiment of the sensor 18 includes a field insulation 52 being arranged underneath the sensor antenna 46 (in the illustration in FIG. 2), i.e. between the sensor antenna 46 and a housing wall intended for the sensor 18 to be mounted on. The field insulation may also be the corresponding housing wall itself. In one exemplary embodiment, the field insulation is an iron plate. In other exemplary embodiments, it is a plate composed of soft iron, ferrite, copper, aluminum or the like. It is self-evident that the magnetic lines of force 50 then assume a different profile in the area underneath the sensor 18 and in consequence are no longer completely rotationally symmetrical. In simpler exemplary embodiments, the field insulation 52 may be omitted. The sensor antenna 46 is then preferably arranged at a distance of about 5 mm or more from the housing outer face on which the sensor 18 is mounted. This distance is denoted by $d_3$ in FIG. 3 (although in this case with reference to the side housing wall 44).

The actuator 16 has an integrated circuit 54, in a manner known per se, and this integrated circuit 54 is connected to an actuator antenna 56. The actuator antenna 56 is here again illustrated as an air coil, but may also have a different form in a specific case. A coding is stored in the circuit 54, and is represented here by symbolic lines 58. The coding 58 is allocated individually to the actuator 16, so that the sensor 18 can identify the actuator 16 on the basis of the coding 58.

Typically, the actuator 16 illustrated here does not have its own dedicated power supply. In fact, the power to supply the integrated circuit 54 is obtained from the sensor 18 when the two antennas 46, 56 have sufficiently strong transformer coupling. Coupling such as this exists when the lines of force 50 of the magnetic field which is produced by the sensor antenna 46 have an orthogonal component which passes through the flat cross section of the actuator antenna 56, as is illustrated for the actuator 16 in FIG. 2. The circuit 54 is then excited and modulates the existing field with the internal coding 58, which can be detected and evaluated by the circuit 48 in the sensor 18.

Since the magnetic field 50 of the sensor antenna 46 becomes weaker as the distance increases, the transformer coupling is dependent on the distance between the actuator 16 and the sensor 18. When the distance is less than a defined switching distance, the sensor 18 can read the actuator 16. Beyond the corresponding distance, no communication is possible between the two. The corresponding switching distance is indicated symbolically in FIG. 2 by the reference number 60.

The sensor antenna 46 in this exemplary embodiment has a largely omnidirectional directional characteristic 62 (see FIG. 3). In consequence, transformer coupling between the actuator 16 and the sensor 18 is in this case possible not only when the actuator 16 approaches the sensor 18 from the front, i.e. in the direction of arrow 64. In fact, coupling is also possible when the actuator 16 approaches from approach directions at the side (arrows 66, 68). This is because of the line of force distribution 50 indicated in FIG. 2. As illustrated, perpendicular line of force components also occur as a result of the flat cross section of the actuator antenna 56 when the actuator 16 is located at the positions denoted by 16' and 16". The safety switch 36 thus allows mutually perpendicular approach directions between the actuator 16 and the sensor 18.

The actuator orientation shown by the reference number 16" is presently preferred for approaching sensor from the side in practical implementations, i.e. actuator is in this case rotated by 90° with respect to the approach direction 64. In this case, the actuator can be moved to the same distance from the sensor, irrespective of the approach direction. Otherwise (orientation according to 16'), a large coil diameter of the actuator antenna 56 may mechanically impede close proximity. However, in principle, the orientation 16' is also possible.

FIG. 3 illustrates the directional characteristic 62 of the sensor antenna 46 in a simplified form. This relates, in a manner known per se, to the three-dimensional profile of the same field strength for a magnetic field component which here is parallel to the approach direction 64 (FIG. 2) of the actuator 16. This line of force component is the governing factor when the actuator 16 approaches the sensor 18 in the orientation which corresponds to the positions with the reference numbers 16 and 16' in FIG. 2.

If, in contrast, the actuator approaches the sensor 18 in an orientation rotated by 90° with respect to this (reference number 16"), the field components at right angles to this are the governing factor, which would lead to the directional characteristic having a different appearance (specifically in the form of a four-leafed clover leaf whose leaves are located approximately diagonally with respect to the longitudinal axis of the coil 46). The directional characteristic may thus have different profiles, and therefore different switching distances depending on the orientation of the actuator 16, 16". However, this does not affect the fundamental principle of the "omnidirectional" characteristic.

As illustrated in FIG. 3, the directional characteristic 62 has a first preferential direction 72 in the direction of the longitudinal axis of the air coil 46, and a second preferential direction 74 transversely with respect to it. For an air coil, the two preferential directions 72, 74 are basically symmetrical with respect to a plane through the imaginary center point 76 of the air coil 46. This results in two preferential directions of equal strength in each case, in opposite directions to one another. In comparison to one another, the two preferential directions 72, 74 have differently pronounced strengths, however, as can be seen from the circle 78 that is used for illustrative purposes. Specifically, the first preferential direction 72 (parallel to the longitudinal axis of the air coil 46) is more pronounced than the second preferential direction 74. In other words, the field strength at the same distance from the air coil 46 is stronger in the first preferential direction 72, and the profile of equal field strength extends to a greater distance in the first preferential direction 72. The air coil 46 thus intrinsically leads to different switching distances between the actuator 16 and the sensor 18 as a function of the approach direction.

In order to compensate for this, the air coil 46 is in this case arranged at different distances $d_1$ and $d_2$ from the respective housing walls 40 and 42, 44. Specifically, the air coil 46 is at the same, shorter distance $d_2$ from the two side housing walls 42, 44, while it is at a greater distance $d_1$ away from the front housing wall 40. In consequence, the switching distances are matched to one another when approached in the two preferential directions 72, 74, as is indicated in FIG. 3 by the switching distances 60a, 60b.

Figure 4:
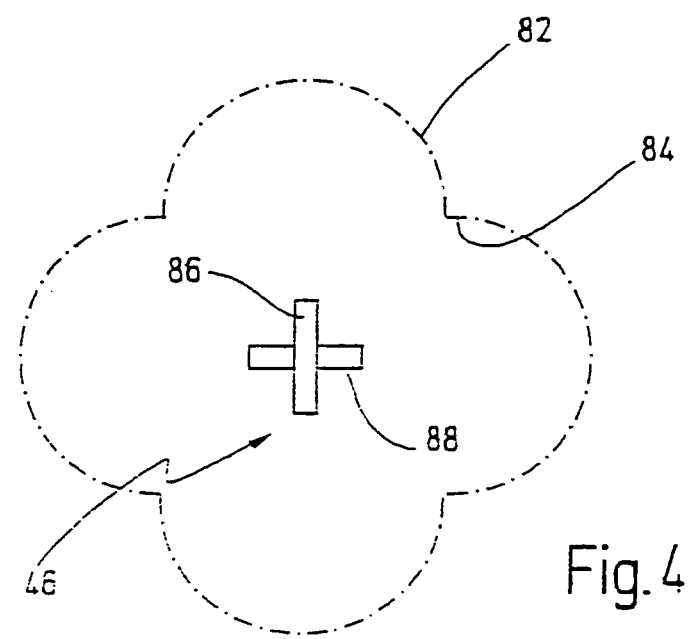
FIG. 4 shows a principle circuit diagram for a further exemplary embodiment of the novel safety switch.

FIG. 4 shows a simplified illustration of a further directional characteristic 82 for a sensor antenna. The directional characteristic 82 is pronounced to approximately the same extent in the mutually perpendicular spatial directions, although the relevant persons skilled in the art will be aware that it may nevertheless have notches 84 at some points. In this case, this approximately uniform configuration of the directional characteristic is achieved by the use of a plurality of antenna elements 86, 88. By way of example, in the illustrated exemplary embodiment, two air coils 86, 88 are arranged crossed over with respect to one another, and are connected to one another in such a way that their individual directional characteristics are superimposed to form the more uniform overall diagram 82. As can easily be seen, the directional characteristic 82 results in the switching distances being even better matched to one another in the different approach directions 64, 66.

Figure 5:
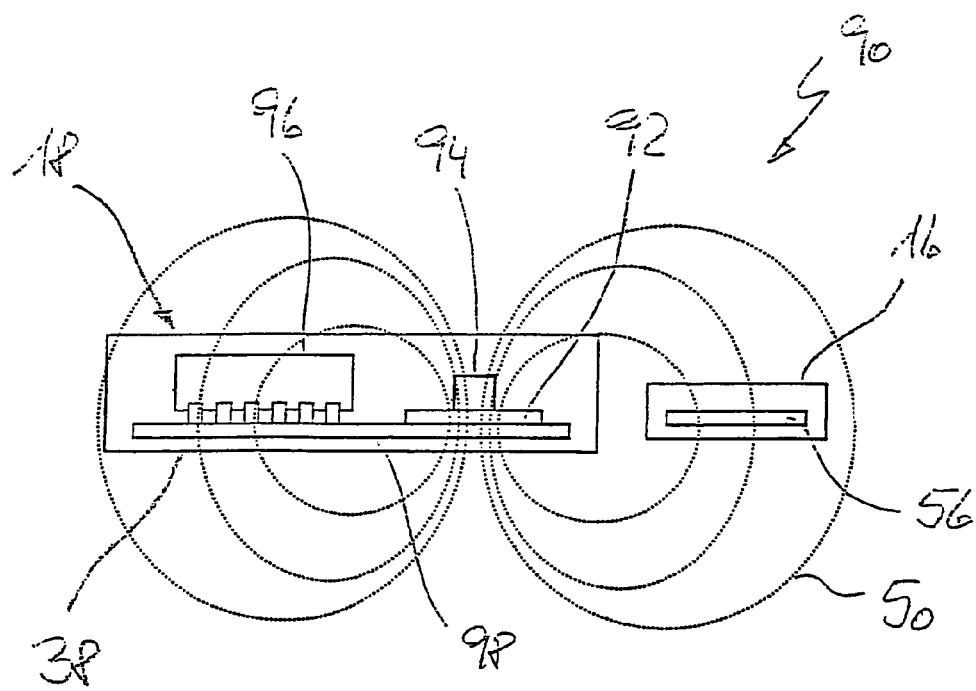
FIG. 5 shows a simplified illustration of a further exemplary embodiment of the novel safety switch.
Figure 6:
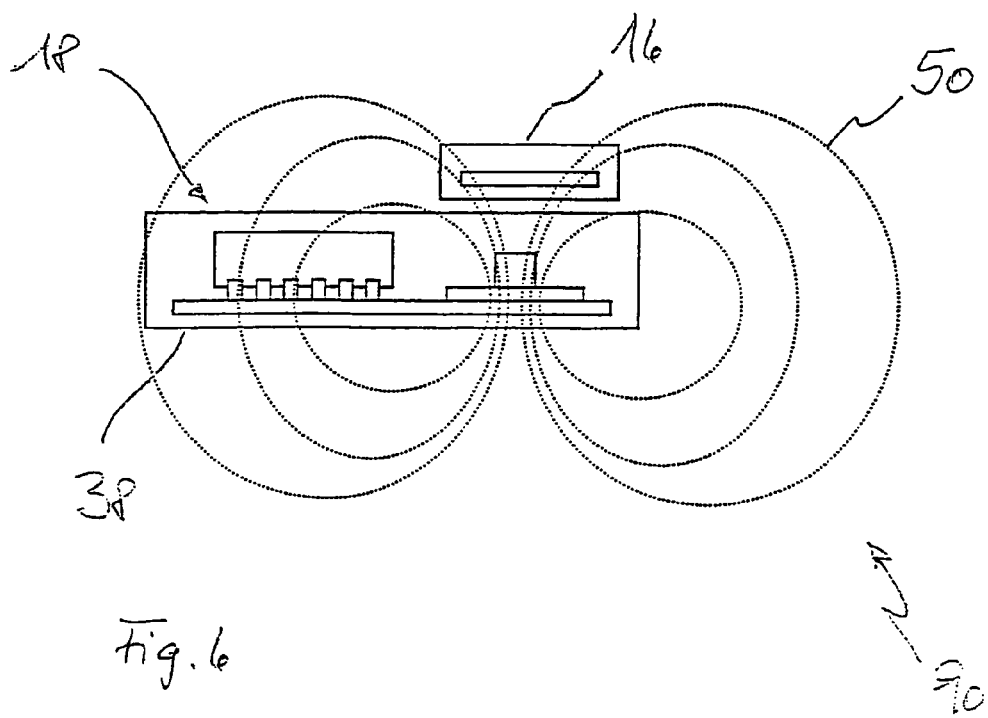
FIG. 6 shows the safety switch from FIG. 5 in a second operating position.

FIGS. 5 and 6 show a further exemplary embodiment of the novel safety switch, which in this case is denoted by the reference number 90 in total. Apart from this, same reference symbols denote the same elements as before.

The sensor 18 of the safety switch 90 has a sensor antenna 92 in the form of a flat horizontal coil. This may be a coil composed of wound wire or the like. In the preferred exemplary embodiment, the coil 92 is, however, in the form of a printed or etched conductor track on a circuit board. Irrespective of this, the coil 92 in this case has a ferrite core 94 arranged in the center. The ferrite core concentrates the magnetic lines of force 50, but in contrast to the ferrite pots which are used in prior art, it does not provide for a single operating direction or preferential direction. It is self-evident that a ferrite core such as this can also be used in the previous exemplary embodiments.

In this case, the coil 92 is arranged together with other components 96 of the sensor on a circuit board 98. By way of example, but not in a restricted manner, an IC is illustrated in this case as another component and may, for example, be an ASIC.

In this exemplary embodiment, the actuator antenna 56 is likewise in the form of a flat (air) coil. As is illustrated in FIGS. 5 and 6, the actuator antenna 56 can be transformer-coupled to the sensor antenna 92 from a plurality of positions by virtue of the projecting distribution of the lines of force. It is thus possible to approach the sensor from different directions without the sensor or the sensor antenna having to be reinstalled. On the other hand, the horizontal arrangement of the antennas results in a very flat shape, which allows physically small installation, particularly for the approach position illustrated in FIG. 6.

The present invention has been described here with reference to preferred exemplary embodiments in which a transponder (tag), which is known per se, is used for the actuator 16. Thus, the transformer coupling between the actuator 16 and the sensor 18, to be more precise between the actuator antenna 56 and the sensor antenna 46, must be sufficiently strong to excite the transponder. For the purposes of the present invention, this state is referred to as transponder-like coupling. In contrast to this preferred exemplary embodiment, the principle of the invention may, however, also be used for safety switches which are not based on the evaluation of a transponder. The general field of application thus also includes transformer couplings between an actuator 16 and a sensor 18 which do not include a transponder.

What is claimed is:

1. A safety switch for monitoring a closed position of a guard door in an automated installation, said guard door comprising a fixed part and a moveable part, and the safety switch comprising:

an actuator and a sensor each adapted to be secured to one of the parts, wherein the actuator has a transponder including an actuator antenna and the sensor has a sensor antenna, wherein the antennas are configured to establish a transponder coupling, when the parts are in the closed position, wherein the sensor antenna has a magnetic directional characteristic which allows the transponder coupling in at least two spatial directions that are mutually perpendicular as seen from the sensor antenna, and further wherein the magnetic directional characteristic comprises a stronger first preferential direction and a weaker second preferential direction allowing the transponder coupling, wherein the sensor antenna is arranged in an antenna housing having housing walls, and wherein a distance between the sensor antenna and the housing walls in the first preferential direction is longer than in the second preferential direction.

2. The safety switch of claim 1, wherein the sensor antenna has a substantially omnidirectional characteristic.

3. The safety switch of claim 1, wherein the sensor antenna comprises a plurality of antenna elements having a plurality of directional characteristics aligned differently.

4. The safety switch of claim 1, wherein the sensor antenna comprises an air coil.

5. The safety switch of claim 1, wherein the sensor comprises a circuit board, and wherein the sensor antenna comprises a coil that is flatly arranged on the circuit board.

6. The safety switch of claim 5, wherein the coil is implemented in the form of a conductor track on the circuit board.

7. The safety switch of claim 1, wherein the sensor antenna, perpendicular to the first preferential direction, is arranged at same distances from at least two housing walls.

8. The safety switch of claim 1, wherein the sensor comprises a sensor housing having a mounting face and a field insulation which is arranged between the sensor antenna and the mounting face.

9. The safety switch of claim 8, wherein the field insulation is a magnetically conductive plate.

10. The safety switch of claim 8, wherein the field insulation is an electrically conductive plate.

11. The safety switch of claim 1, wherein the sensor comprises a sensor housing having a mounting face, and wherein a distance between the sensor antenna and the mounting face is approximately 5 mm or more.

12. The safety switch of claim 1, wherein the actuator antenna has a first orientation for establishing the transponder coupling in a first of the at least two perpendicular spatial directions, and the actuator antenna has a second orientation for establishing the transponder coupling in a second of the at least two perpendicular spatial directions, wherein the first and the second orientations are rotated by about 90° with respect to one another.

13. A safety switch for monitoring an adjacent position of two parts which are moveable relative to one another, comprising:
   an actuator and a sensor each adapted to be secured to one of the parts,
   wherein the actuator has an actuator antenna and the sensor has a sensor antenna,
   wherein the antennas are configured to establish a defined transformer coupling, when the parts are in the adjacent position,
   wherein the sensor antenna has a magnetic directional characteristic which allows the defined transformer coupling in at least two spatial directions that are mutually perpendicular as seen from the sensor antenna, and further
   wherein the directional characteristic comprises a stronger first preferential direction and a weaker second preferential direction allowing the transformer coupling, wherein the sensor antenna is arranged in an antenna housing having housing walls, and wherein a distance between the sensor antenna and the housing walls in the first preferential direction is longer than in the second preferential direction.

14. The safety switch of claim 13, wherein the sensor antenna has a substantially omnidirectional characteristic.

15. The safety switch of claim 13, wherein the sensor antenna comprises a plurality of antenna elements having a plurality of directional characteristics aligned differently.

16. The safety switch of claim 13, wherein the sensor antenna comprises an air coil.

17. The safety switch of claim 13, wherein the sensor comprises a circuit board, and wherein the sensor antenna comprises a coil that is flatly arranged on the circuit board.

18. The safety switch of claim 17, wherein the coil is implemented in the form of a conductor track on the circuit board.

19. The safety switch of claim 13, wherein the sensor antenna, perpendicular to the first preferential direction, is arranged at same distances from at least two housing walls.

20. The safety switch of claim 13, wherein the actuator antenna has a first orientation for establishing the transformer coupling in a first of the at least two perpendicular spatial directions, and the actuator antenna has a second orientation for establishing the transformer coupling in a second of the at least two perpendicular spatial directions, wherein the first and the second orientations are rotated by about 90° with respect to one another.

21. The safety switch of claim 13, wherein the actuator comprises a transponder circuit connected to the actuator antenna, and wherein the transformer coupling is a transponder coupling.

* * * * *